United States Patent [19]

Sokoler

[11] Patent Number: 5,907,587
[45] Date of Patent: May 25, 1999

[54] METHOD AND APPARATUS FOR CLOCK RECOVERY

[75] Inventor: Izydor Sokoler, Copenhagen, Denmark

[73] Assignee: Nokia PHones Limited, Salo, Finland

[21] Appl. No.: 08/796,612

[22] Filed: Feb. 7, 1997

[30]     Foreign Application Priority Data

Feb. 8, 1996 [GB]  United Kingdom ................. 9602585

[51] Int. Cl.$^6$ ...................................................... H04L 7/00
[52] U.S. Cl. ......................... 375/368; 375/367; 375/366; 455/464
[58] Field of Search .................................. 375/376, 355, 375/371, 373, 354, 366, 359, 360, 362, 368, 367, 200, 343; 327/141, 231, 166, 261, 48; 331/17; 370/277; 455/464

[56]         References Cited

U.S. PATENT DOCUMENTS

| 5,325,405 | 6/1994 | Marko et al. ............................ 375/366 |
| 5,410,570 | 4/1995 | Ladha et al. ............................ 375/367 |
| 5,434,905 | 7/1995 | Maeda et al. ........................... 455/464 |
| 5,479,451 | 12/1995 | Eldering et al. ........................ 375/343 |

FOREIGN PATENT DOCUMENTS 2246036  1/1992  United Kingdom .............. H04L 7/02

OTHER PUBLICATIONS

Eldering et al., Digital Burst Mode Clock Recovery Technique for Fiber–Optic Systems, Journal of Lightwave Technology, vol. 12, No. 2, pp. 271–279, Feb. 1994.

*Primary Examiner*—Stephen Chin
*Assistant Examiner*—Shuwang Liu
*Attorney, Agent, or Firm*—Perman & Green, LLP

[57]              ABSTRACT

A data clock signal for data in an incoming signal is generated by means of a clock recovery module. The incoming signal consists of a data burst having a periodic preamble followed by a data sequence. The clock recovery module comprises a first clock generator, a sampling device, a correlator, a control unit and a time registration device. The clock generator generates a clock signal having a first clock frequency which is a factor N higher than the frequency of the preamble. The sampling device samples the incoming signal at the first clock frequency. The correlator correlates the sampled signal with a predefined correlation word, the correlation between the incoming signal and the correlation word being represented as a correlation signal in the form of a series of discrete correlation signal values. The control unit detects local extreme values for the correlation signal. The time registration unit forms a status value upon detection of local extreme values in the correlation signal and in response to the associated clock pulses in the clock signal. The control unit generates the data clock signal in response to the clock signal from the first clock generator and the status value of the time registration unit.

10 Claims, 6 Drawing Sheets

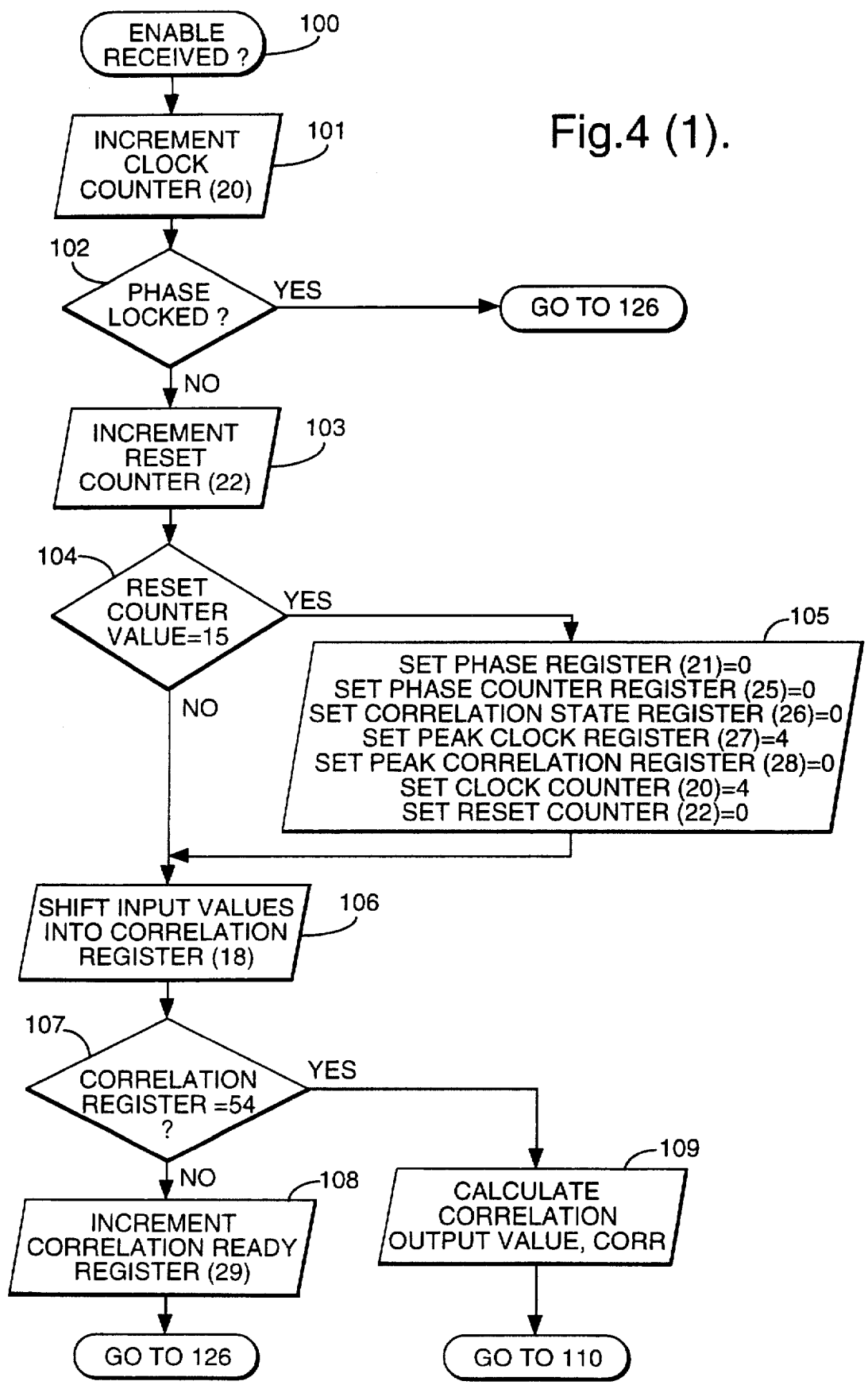
Fig.4 (1).

Fig.4 (2).
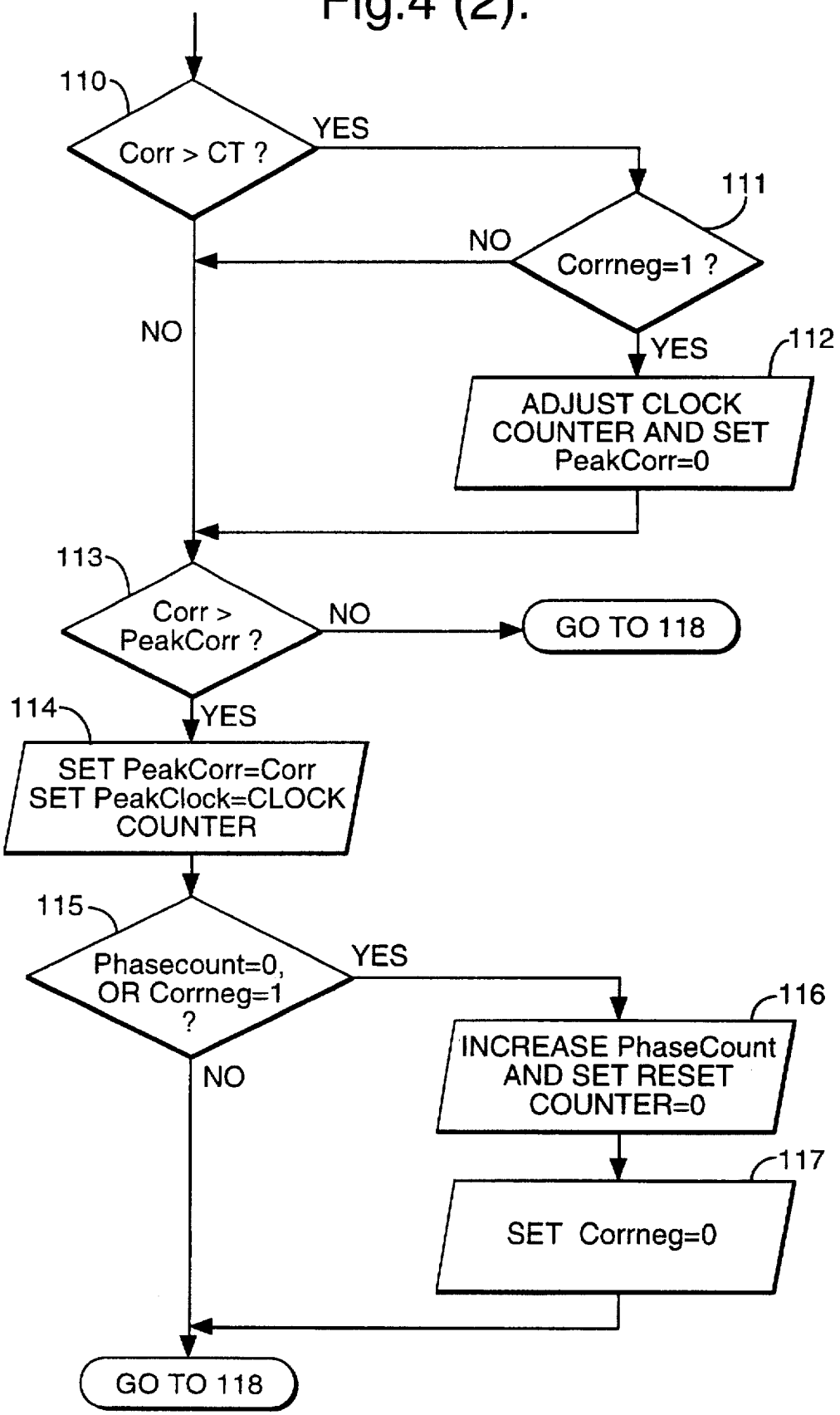

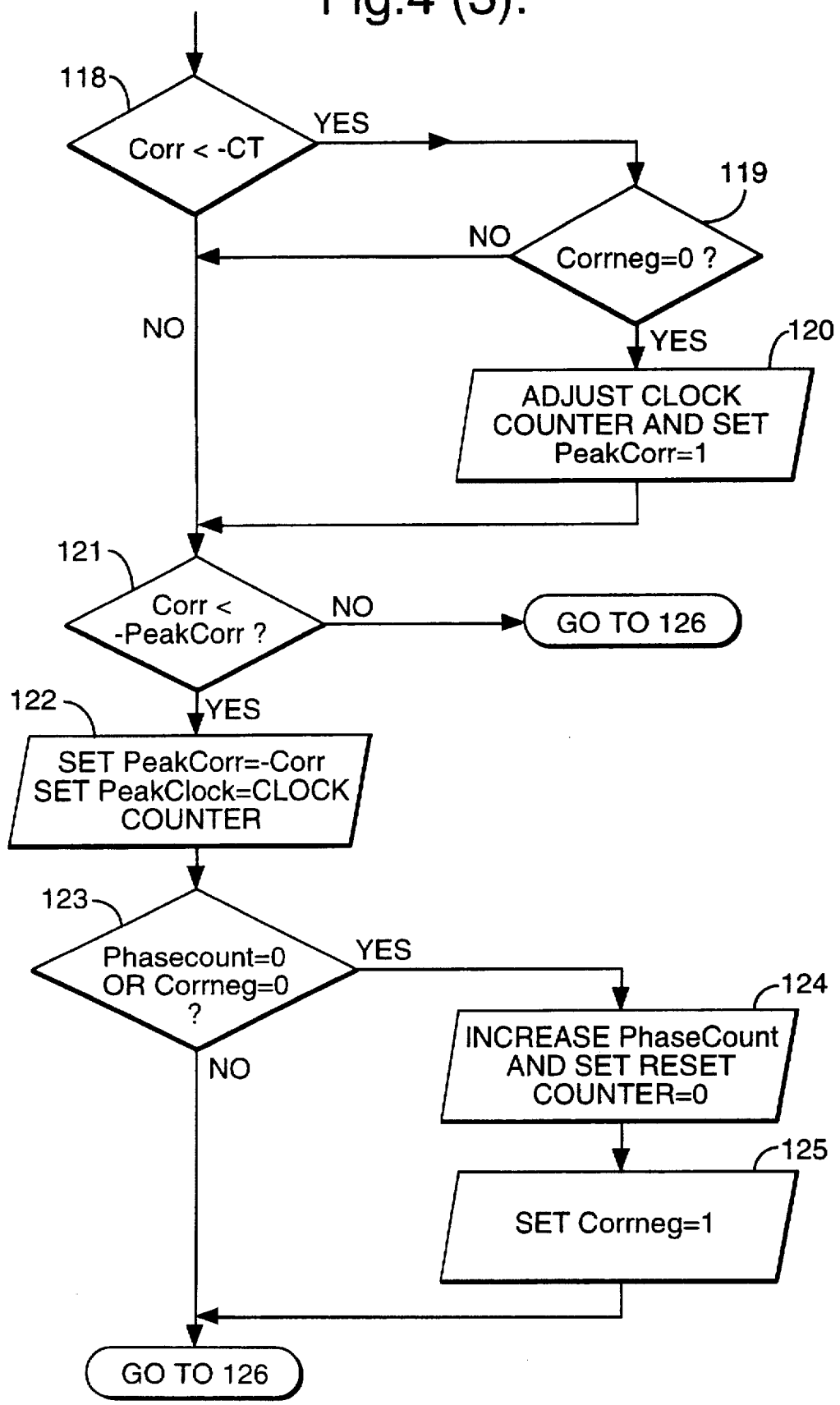
Fig.4 (3).

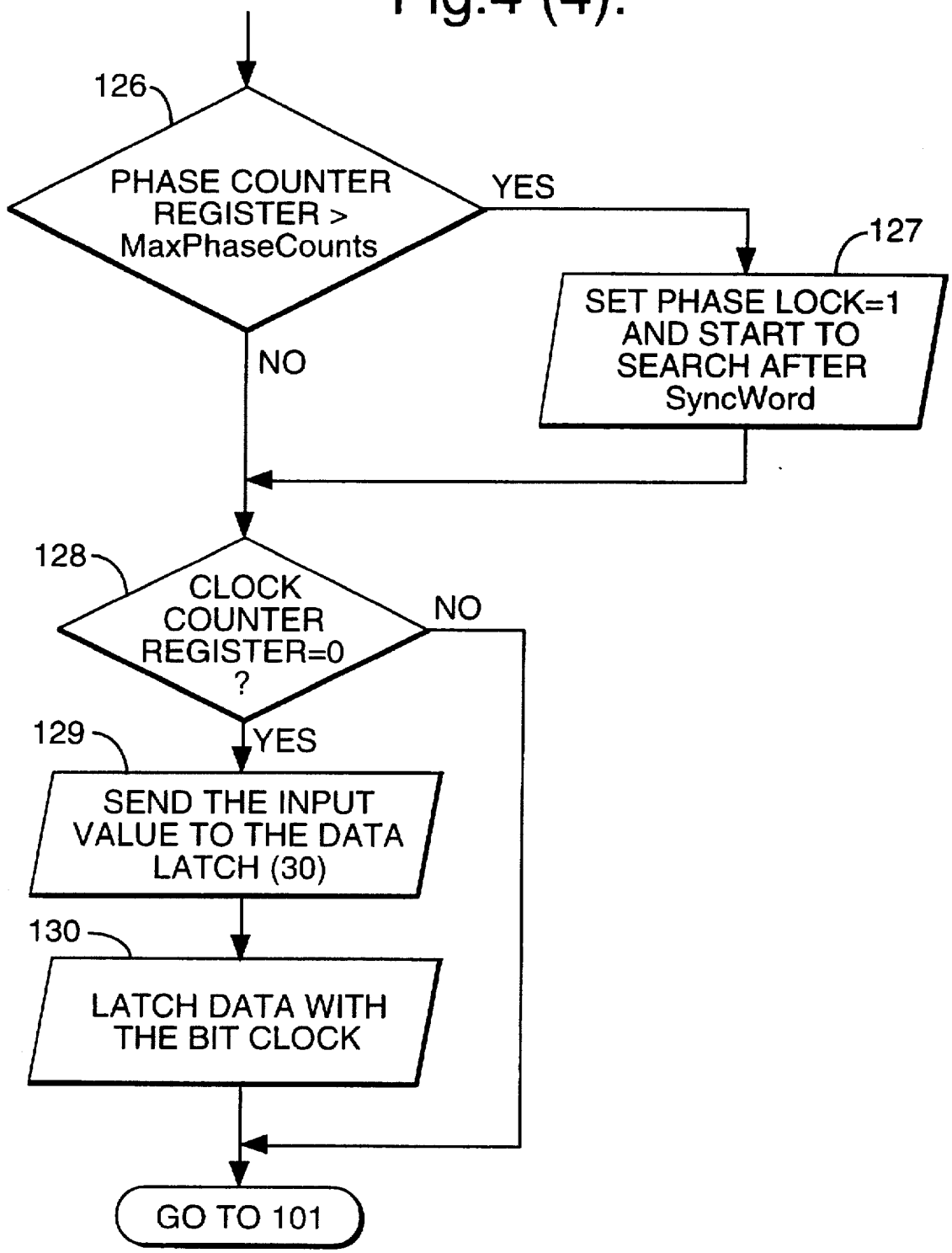
Fig.4 (4).

1

METHOD AND APPARATUS FOR CLOCK RECOVERY

BACKGROUND OF THE INVENTION

The invention concerns a method of recovering the data clock signal for data in an incoming signal which comprises a data burst having a periodic preamble followed by a data sequence. Finally, the invention concerns a clock recovery module for performing the method, and a cordless telephone having such a module for recovering the signal clock for the incoming signal.

Transmission of data between a fixed part and a cordless telephone (portable part) takes place in the form of data sequences which are transmitted in time slots (TDMA— time division multiplex access). In DECT systems, a single data burst comprises a preamble, a sync word and a data sequence. The preamble, which is in the form of an alternating data flow and has a length corresponding to sixteen data bit periods, enables the receiver (the cordless telephone) to adjust the clock frequency and phase of the receiver to the transmitter. The sync word is used for clearly fixing the time of the arrival of the actual data sequence. Like the sync word, the data sequence is in the form of bits, which are GFSK-modulated in DECT systems.

When data in the data sequence transmitted by a fixed part upon a call are received by a cordless telephone, the preamble is used by the clock recovery module for finding the centre of the data pulses so that sampling can subsequently take place in an optimum manner. One bit quantization of the data pulses is usually less affected by noise in the centre. Therefore, it is frequently desired to place the sampling times centrally in a pulse.

SUMMARY OF THE INVENTION

The method of the invention comprises sampling the incoming signal at a first clock frequency which is a factor N higher than the preamble data bit rate (at a digital bit flow) or frequency (at a periodic signal, e.g. a sine signal). Then the sampled signal is correlated by a predefined correlation word to provide a correlation signal in the form of a series of discrete correlation signal values. Local extreme values in the correlation signal are detected, and the associated clock pulses in the clock signal are registered temporally. A data clock signal is generated by selecting clock pulses from the clock signal at the first clock frequency in response to the temporal registration of the clock pulses associated with the detected local extreme values in the correlation signal.

The invention provides a method by which optimum sampling times for data in an incoming signal may be determined on the basis of a periodic preamble which begins a data burst.

The clock recovery technique of the invention will work very well even under cochannel conditions. The reason is that the method of the invention will average out the clock jitter during the preamble sequence, and thus be quite immune to the clock jitter produced by a cochannel signal. At the end of the preamble at the start of the data sequence a very good estimate of the original clock is obtained even in very noisy conditions.

When the preamble consists of a sequence of alternating data bits (alternately "0"s and "1"s, oversampling is performed with respect to the data bit rate, while in case of analog, periodic signals, such as sine signals, oversampling is performed with respect to the frequency of the signal. When reference is made to a frequency which corresponds to the period of the preamble in the patent claims, this means the frequency of the analog signal or half the bit rate of the digital signal in the method described herein.

The temporal registration may advantageously comprise cyclic counting of the clock pulses by a counter which has status values in a counting cycle, monitoring of the status of the counter by detecting an extreme value in the correlation signal, the generation of the data clock signal being performed by selecting clock pulses from the clock signal at a first clock frequency in response to the status of the counter.

Hereby, in e.g. a DECT system, it is possible to use the system clock having a clock frequency of e.g. 10.368 Mhz as a sampling frequency, which corresponds to an oversampling by a factor of 9, since the data bit rate will be 1152 kbits. Simultaneously, a counter having a counter cycle of 9 may be used for counting the clock signal. The correlation word is usually preselected, and it usually corresponds to a plurality of data bit periods of the signal to be correlated. The generated correlation signal will likewise be periodic, and the data clock signal of the cordless telephone may be brought into phase with the received signal by finding the extreme values (minimum and maximum), thereby ensuring optimum sampling times. This is done by comparing successive correlation signal values and registering the peaks.

During the preamble, it may hereby be determined clearly when there is maximum correlation between the periodic signal and the correlation word. Division of the system clock signal by 9 will give nine mutually phase-shifted clock signals having a clock frequency of 1152 kHz, and the counter may be used for selecting that of the nine clock signals which is best suited for the optimum sampling time. This means in practice that the counter status for extreme values in the correlation signal is determined during the preamble, and this status of the counter is used for controlling the data sampling clock signal in the subsequent sampling of data in the data burst.

The invention moreover concerns a clock recovery module for recovering a data clock signal for data in an incoming signal which consists of a data burst having a periodic preamble followed by a data sequence. The clock recovery module comprises a clock generator which generates a clock signal having a first clock frequency which is a factor N higher than the data bit rate or frequency of the preamble, a sampling device sampling the incoming signal at the first clock frequency, a correlator correlating the sampled signal with a predefined correlation word, the correlation between the incoming signal and the correlation word being represented as a correlation signal in the form of a series of discrete correlation signal values, a peak value detector receiving the correlation signal from the correlator for detecting local extreme values for the correlation signal, a control unit detecting the local extreme values in the correlation signal. A time registration unit provides a status value in response to the detected local extreme values in the correlation signal and the associated clock pulses in the clock signal. The control unit generates the data clock signal in response to the clock signal from the first clock generator and the status value of the time registration unit. Averaging of clock jitter will hereby be performed during the preamble.

The clock recovery technique of the invention will work very well even under cochannel conditions. The reason is that the method of the invention averages out the clock jitter during the preamble sequence, and is thus quite immune to the clock jitter produced by a cochannel signal. At the end of the preamble at the start of the data sequence a very good estimate of the original clock is obtained even in very noisy conditions.

3

The clock recovery procedure continues during the entire preamble. A closed loop operation is performed hereby, and the clock error is averaged out. When the sync word begins, the clock counter is "frozen" for the rest of the time slot. In a preferred embodiment, the time registration unit comprises a counter which has an input to receive the clock signal and N status values in a counting cycle, said counter changing its status on reception of a clock pulse. Here, the time registration unit moreover comprises a monitoring unit to register the status of the counter when detecting an extreme value in the correlation signal. The data clock signal is generated by the second clock generator by selecting clock pulses from the clock signal having a first clock frequency under control of the counter and/or the monitoring unit. The clock signal may hereby be divided into N phases, the phase in best agreement with the optimum sampling time being used as a data clock signal for the subsequent data.

The preamble signal is usually an alternating flow of data bits, and it may be affected by noise. Advantageously, the signal may be one-bit quantized before sampling. This may be done by passing the signal through a quantizer, whereby it will appear as sequences with the length N of alternately binary "0n" and "1" in the subsequent sampling.

When the control unit of the clock recovery module has an associated correction facility which receives information on the current status of the counter and which compares this status with a desired status interval, the correction facility may generate a correction signal which is applied to the counter to correct its status. Hereby, when the counter is corrected toward a predetermined value each time an extreme value is detected, the occurrence of a predetermined counter value may control the data clock signal. This makes the control of the data clock generator very simple.

In the preferred embodiment, the counter changes its status toward the desired status interval on reception of the correction signal from the correction device, and this change may advantageously take place as an increment or a decrement by the value one. The counter will hereby be able to adjust itself during the preamble irrespective of the start value, and a single error detection of an extreme value will not have any significant influence on the final clock signal.

The clock recovery module may advantageously be used in a cordless telephone for recovering the signal clock for the incoming signal with a view to determining the optimum sampling times for data in the incoming signal on the basis of a periodic preamble, which begins a data burst. If the correlation is performed by a correlator as described in co-pending British patent application No. GB 9602566.3, filed by the applicant on the same date as the present application, the invention may be implemented as hardware components coupled to the other elements of the cordless telephone via software-based control units.

BRIEF DESCRIPTION OF THE DRAWINGS

The invention will be explained more fully below in connection with preferred embodiments and with reference to the drawing, in which:

FIGS. 4(1), 4(2), 4(3) and 4(4) illustrate by way of a flow diagrams the program sequence during the clock recovery according to the invention.

4

DETAILED DESCRIPTION OF THE INVENTION

Figure 1:
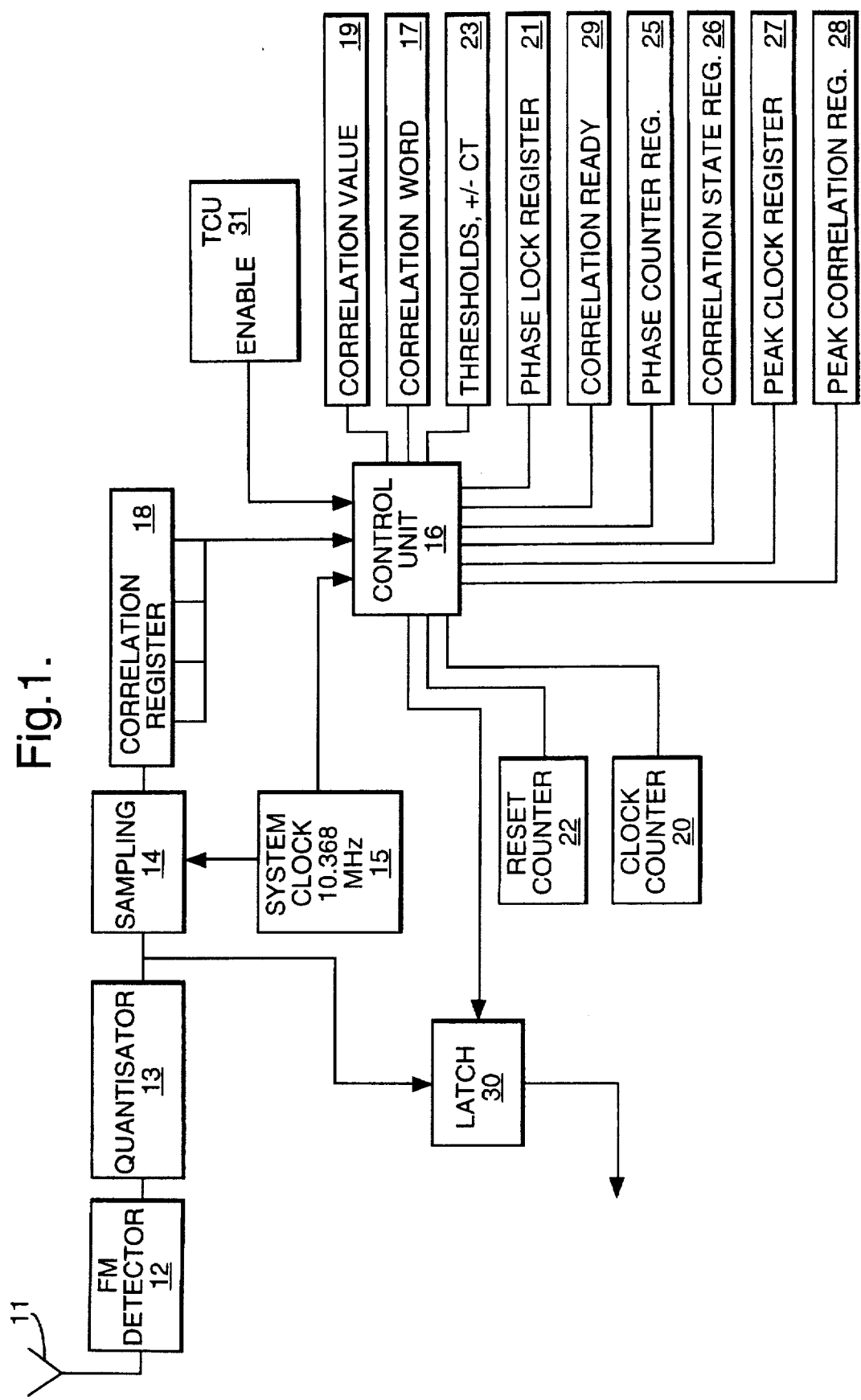
FIG. 1 schematically shows a preferred embodiment of a clock recovery module of the invention.
Figure 2:
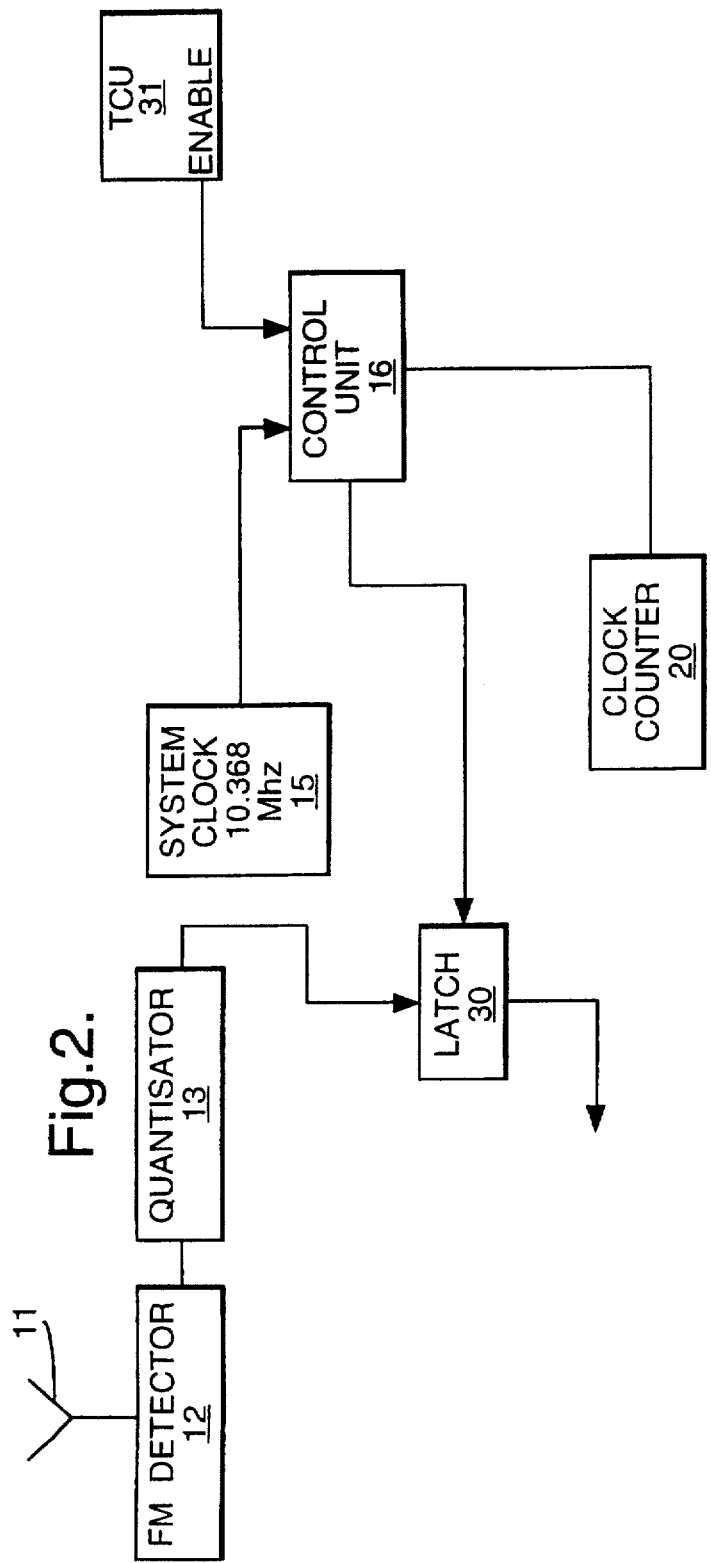
FIG. 2 shows the function of the module shown in FIG. 1 after the clock recovery procedure.

The clock recovery or clock regeneration is performed on the preamble of the data burst, which has a bit rate of 1152 kbits/s. A preferred embodiment of a clock recovery module of the invention is shown in FIG. 1. The module shown may be implemented in a digital cordless telephone, e.g. for communication in the DECT system. A signal is received by an aerial 11, and it is detected by an FM detector 12. In the preferred embodiment, the clock recovery module comprises a quantizer 13 which quantizes the signal received from the FM detector 12, thereby converting the preamble, which is GFSK modulated, from frequency modulation to amplitude modulation having two amplitude levels according to whether the frequency in the signal from the detector 12 is above or below a given threshold value.

The periodic square wave signal is passed from the quantizer 13 to a sampling device 14 which is temporally controlled by the system clock generator 15 of the cordless telephone, which supplies a clock signal at 10.368 Mhz, thereby oversampling the signal by a factor N which is nine in the preferred embodiment. During sampling, the square wave signal is converted into a sequence of bits which, in groups of N bits, alternately assume the value logic "0" or logic "1". The sequence of bits is passed to a correlation register 18 in which the bit sequence is correlated by a predetermined correlation word to provide a correlation signal. The correlation word may advantageously correspond to a plurality of periods, e.g. six data bit periods, of a noiseless, quantized preamble signal, which will give it a length of 54 bits (6 data bit periods×9 samples/data bit period). The correlator may advantageously be constructed as described in the applicant's above-mentioned British patent application. Said British patent application is hereby incorporated by reference in the present application.

Figure 3:
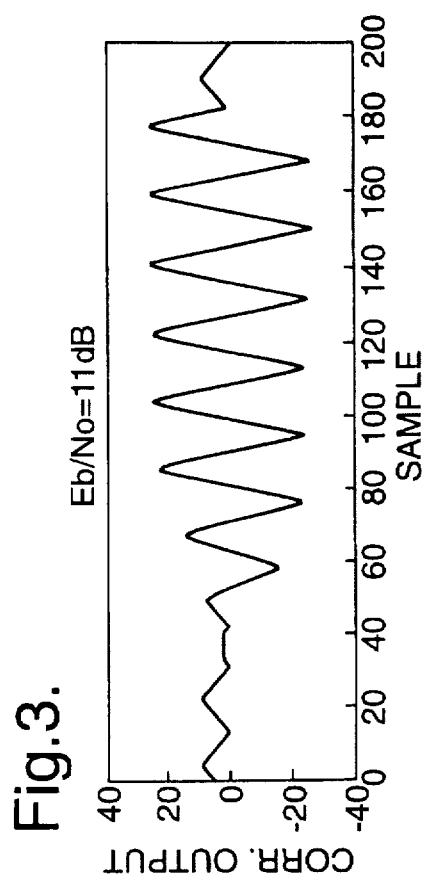
FIG. 3 shows a correlation signal generated by the correlator used in the clock recovery module of the invention.

FIG. 3 shows an example of a correlation signal. In the example shown, the ratio of signal to noise (Eb/No) is 11 dB. The correlation word is represented by the values +1 and −1 at logic "1" and logic "0", while the signal is represented by the values +1 and 0 at logic "1" and "0". With 54 samples in the correlation word, the correlation and thus the correlation signal will be in the range between +27 and −27. It will be seen from FIG. 3 that there is good correlation between signal and correlation word between sample No. about 80 and sample No. about 180, as the peak values of the correlation signal are here significantly above ±20—both as a minimum and a maximum. Thus, it is worth noting that even though a signal with considerable noise is involved, the peak values in the output signal of the correlator will be very close to their maximum values.

The correlation signal is provided in the embodiment outlined in that solely the bits which changed weight factor (associated value for multiplication in the correlation signal) at the last clock pulse, are output from the register 18 and transferred to a control unit 16, in which the output values are multiplied by associated weight factor changes stored as fixed values in an associated register 17. Summation of the products resulting from the above-mentioned multiplications provides a value for a correlation value change, and the current correlation value may be calculated by adding the correlation value change and the previous correlation signal value stored in a register 19. Simultaneously, the calculated correlation signal value is stored in the register 19, in which the value is used for the calculation of the following correlation signal value. The calculation of the correlation signal value takes place in the execution of a program sequence in the control unit 16 and under time control of the system clock generator 15.

The cordless telephone may advantageously operate in two modes, the first mode being without system timing, as a preamble in the incoming bit flow is searched for. Once a sync word has been found, the timing control unit 31 of the telephone activates the second mode of the clock recovery module (FIG. 4, stage 100) by supplying an enable signal immediately before a preamble is expected. The control unit 16 may be part of the central processor of the telephone.

When the clock recovery module is activated, the clock recovery takes place in the control unit 16 by execution of a program sequence, where the control unit 16 initially increments a cyclic counter 20 (increases its status by one) by nine status values and checks the status of a phase lock register 21 indicating whether the receive part of the cordless telephone has already been locked by the phases of the system clock generator 15. This takes place in stages 101 and 102 in FIG. 4(1). If this is the case, the control unit 16 will not search for the signal clock, but instead keep the clock recovery part closed to save energy, which means that the program sequence jumps to stage 126. If the status of the phase lock register 21 indicates that locking has not been effected as yet, the control unit 16 starts a search for a suitable phase among the phases of the system clock generator 15.

The control unit 16 first increments a counter 22 (reset counter), which takes place in stage 103, and then checks its status, which takes place in stage 104. This counter 22 is reset each time the correlation signal value (Corr) increases numerically and passes a threshold value, ±CT, which is stored in a storage 23. As the incoming signal is oversampled by a factor 9, such a passage is expected for every 9th clock pulse. If the contents of the counter 22 in stage 104 assume the value fifteen, the control units 16 concludes that the last passage was due to a false correlation peak, and the counter 22 is therefore reset in stage 105. As the resetting takes place as a consequence of the last passage being evaluated as an error, also the phase lock register 21 and the counter 22 are reset. Simultaneously, three status registers (phase counter register) 25 are reset, in which the number of registered phases are stored, (correlation state register) 26 indicating whether the last-registered correlation peak was positive or negative, and (peak correlation register) 28 containing an indication of the amplitude of the last correlation peak. Finally, a register 20 and a register (peak clock register) 27, which contains information on the status of the counter 20 at the correlation peak last observed, are set at the value four.

The values of the input signal are shifted into the correlation register 18 in stage 106, and the contents of a register (correlation ready register) 29 are examined in stage 107, and if its final value of fifty-four (corresponding to the number of register locations in the correlation register) 18 has not been reached yet, the register 29 is incremented in stage 108. As long as the register 29 has not reached its final value, a correlation value will not be calculated, as the program sequence instead jumps to stage 126.

When the register 29 has reached its final value, the control unit 16 calculates a correlation signal value (Corr) in stage 109 in each clock period, as described above.

The correlation signal value (Corr) is then compared with the threshold value +CT in stage 110, and if the Corr value is greater than the threshold value +CT, and if the contents of the register 26 indicate that the correlation peak found last was negative (stage 111), the counter 20 is adjusted, which takes place in stage 112. Peak Corr is simultaneously set at the value 0.

The counter 20 can assume the values 0, 1, 2, . . . 8. The correlator is constructed so that maximum correlation is achieved upon the input of signal values corresponding to the first register location in the register 18 containing a bit which corresponds to a zero passage. This means that if the counter 20 contains the value four at maximum correlation, then the optimum time of activating the latch 30 will be when the counter 20 contains the value zero. It is accepted that the counter 20 has the value three, four or five as the desired status interval when a correlation peak occurs. If a correlation peak occurred in the status interval zero, one or two at the latest clock period, the counter 20 will extraordinarily be incremented by the value one, while the counter 20 will extraordinarily be decremented by the value one, if the correlation peak occurred in the status interval six, seven or eight. This adjustment takes place in stage 112, as mentioned.

The one bit quantized signal is sampled at a frequency of 1152 kHz by means of a latch 30 which latches the signal each time the counter 20 reaches the value zero.

If, at the comparison in stage 113, the Corr value is greater than a hitherto greatest correlation value (peak Corr) stored in the register 28, the new maximum value is stored in the register 28 instead, and the corresponding status of the counter 20 is transferred to a register 27 as the counter value associated with the peak value. This takes place in stage 114. In stage 115, it is checked whether it is a first detected peak (phase count=0), or whether the last-registered peak was negative (Corr neg=1). If this is the case, the value of the phase count (register 25) is incremented, and the reset counter (counter 22) is reset in stage 116. Corr neg is set at the value 0 in stage 117.

The correlation signal value (Corr) is then compared in stage 118 with the threshold value −CT, and if the Corr value is less than the threshold value −CT, and if the contents of the register 26 indicate that the correlation peak found last was positive (stage 119), the counter 20 is adjusted, which takes place in stage 120 and according to the same guidelines as the adjustment in stage 112. Peak Corr is set at the value 0 at the same time.

If, in the comparison in stage 121, the numerical value of the Corr value is greater than the hitherto greatest correlation value (peak Corr) stored in the register 28, the numerical value of the new maximum value is instead stored in the register 28, and the associated status of the counter 20 is transferred to a register 27 as the counter value associated with the peak value. This takes place in stage 122. It is checked in stage 123 whether it is a first detected peak (phase count=0), or whether the peak registered last was positive (Corr neg=0). If this is the case, the value of the phase count (register 25) and the reset counter (counter 22) are reset in stage 124. Corr neg is set at the value 1 in stage 125.

It is checked in stage 126 whether the value in the register 25 exceeds a predetermined value (max phase count), which will indicate that a predetermined number of peaks has been detected in the correlation signal, and that the preamble signal has been found with subsequent selection of one of the phases of the system clock. If this is the case, the register 21 is caused to indicate in stage 127 that the module is locked to one of the phases of the system clock, and the search for the sync word is initiated at the same time. If the signal is DC compensated before reaching the clock recovery module, the phase count passage of the predetermined value (max phase count) may be used to indicate that a good bit error rate will be obtained by maintaining the DC compensation value for the rest of the data burst.

It is checked in stage 128 whether the counter 20 is at zero. If this is not the case, the entire program sequence is repeated. If, on the other hand, the counter 20 is at zero, the input signal is transmitted to the latch 30 in stage 129, and data are latched in stage 130 to the output with either the leading edge or the trailing edge of the clock signal bit from the control unit 16. The control unit 16 controls the latch 30 by means of the data clock signal, which is generated in response to the status of the counter 30 in the embodiment shown. Then the entire sequence is repeated.

The threshold values ±CT may advantageously be varied automatically in response to the current mode (locked or unlocked) of the telephone. When the telephone is in the unlocked mode, CT may advantageously be set high, thereby reducing the probability that false preambles are detected. Conversely, CT may be lowered when the telephone is in the locked mode, as the timing control unit 31 of the telephone knows when a preamble may be expected to occur, and can thereby control the clock recovery module in response to this. This increases the probability of detecting a larger number of correlation peaks.

Once one of the nine phases, which can be obtained by dividing the system clock signal by nine, has been selected, the clock recovery module of the invention may advantageously be made inactive until the next preamble is expected to arrive. This is controlled by the TCU 31 of the cordless telephone, the enable signal for the control unit 16 being set low. When receiving a clock pulse from the clock generator 15, the control unit 16 hereby increments the counter 20, and when the counter 20 contains the value zero, the control unit 16 transfers the data clock signal to the latch 30, which latches data on the input to the output in response thereto.

Instead of correcting the counter 20 so that the correlation peak occurs close to a predetermined counter status, the control unit may register the counter status when the peak value is detected. In this case, the control unit may have an associated calculating facility to statistically determine a counter status value representing the extreme values of the correlation signal on the basis of the registered status information on the counter. The data clock, which controls the latch or a sampling device, may hereby be provided in dependence on the counter status value determined by the associated calculating facility. The statistical determination may e.g. be performed as an average value determination or as a selection of the most frequently occurring counter status. The present invention includes any novel feature or combination of features disclosed herein either explicitly or any generalisation thereof irrespective of whether or not it relates to the claimed invention or mitigates any or all of the problems addressed.

In view of the foregoing description it will be evident to a person skilled in the art that various modifications may be made within the scope of the invention.

What is claimed is:

1. A method of recovering the data signal clock for data in an incoming signal which comprises a data burst having a periodic preamble followed by a data sequence, said method comprising the steps of:
    sampling the incoming signal using a clock signal having a first clock frequency which is a factor N higher than the frequency corresponding to the period of the preamble,
    correlating the sampled signal with a predefined correlation word to provide a correlation signal in the form of a series of discrete correlation signal values,
    detecting local extreme values in the correlation signal, and temporally registering the associated clock pulses in the clock signal by cyclic counting of the clock pulses by a counter which has status values in a counter cycle,
    monitoring the status of the counter by detecting an extreme value in the correlation signal, and
    generating a data clock signal by selecting clock pulses from the clock signal having the first clock frequency in response to the status of the counter.

2. A method according to claim 1, wherein the monitoring of the status of the counter includes comparing the current status of the counter with a predefined status interval by detecting an extreme value in the correlation signal, and correcting the status of the counter toward the predefined status interval if the current status is outside this interval.

3. A method according to claim 1, wherein the generation of the data clock signal is performed by dividing the clock signal by a factor N and selecting one of the resulting N phases as a data clock signal in response to the status of the counter.

4. A clock recovery module for recovering a data clock signal for data in an incoming signal which consists of a data burst having a periodic preamble followed by a data sequence, said module comprising:
    a first clock generator for generating a clock signal having a first clock frequency which is a factor N higher than a frequency corresponding to the period of the preamble,
    a sampling device for sampling the incoming signal at the first clock frequency,
    a correlator for correlating the sampled signal with a predefined correlation word, the correlation between the incoming signal and the correlation word being represented as a correlation signal in the form of a series of discrete correlation signal values,
    a control unit for detecting local extreme values for the correlation signal,
    a time registration unit for providing a status value by detection of local extreme values in the correlation signal and in response to the associated clock pulses in the clock signal and comprising a counter having an input to receive the clock signal from the clock generator and N status values in a counter cycle, said counter changing status on reception of a clock pulse, and
    said control unit monitoring the status of the counter by detection of an extreme value in the correlation signal, said data clock signal from the control until being generated by selecting clock pulses from the clock signal from the clock generator in response to the associated status of the counter.

5. A clock recovery module according to claim 4, wherein the incoming signal, prior to sampling, is passed to a quantizer which quantizes the signal.

6. A clock recovery module according to claim 4, wherein the control unit comprises a correction facility having information on a predesired status interval of the counter at the occurrence of an extreme value, said correction facility, when the control unit detects an extreme value, comparing the current status of the counter with the desired status interval, said control unit generating, in response thereto, a correction signal for the counter to correct the status of the counter.

7. A clock recovery module according to claim 6, wherein the counter changes status toward the desired status interval on reception of the correction signal from the control unit.

8. A clock recovery module according to claim 6, wherein the counter is incremented or decremented by the value one on reception of the correction signal from the control unit.

9. A clock recovery module according to claim 4, wherein the control unit has an associated counter counting the number of clock periods from the latest extreme value in the clock signal, and wherein the control unit, if the number of clock periods exceeds a predetermined value, identifies the latest extreme value as being a false correlation peak.

10. A cordless telephone having a clock recovery module according to claim 4 for recovering the data signal clock for an incoming signal for determining the optimum sampling times for data in the incoming signal on the basis of a periodic preamble which begins a data burst.

* * * * *